United States Patent
Bai et al.

(10) Patent No.: US 10,600,653 B2
(45) Date of Patent: Mar. 24, 2020

(54) METHOD FOR FORMING A FINE PATTERN

(71) Applicant: Samsung Electronics Co., Ltd., Suwon-si, Gyeonggi-do (KR)

(72) Inventors: KeunHee Bai, Suwon-si (KR);
Jongchul Park, Seongnam-si (KR);
Seungjun Kim, Daejeon (KR);
Seungju Park, Hwaseong-si (KR);
Young-Ju Park, Suwon-si (KR);
Hak-Sun Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/263,759

(22) Filed: Jan. 31, 2019

(65) Prior Publication Data
US 2019/0267246 A1     Aug. 29, 2019

(30) Foreign Application Priority Data
Feb. 23, 2018 (KR) .................. 10-2018-0021955

(51) Int. Cl.
*H01L 21/3065* (2006.01)
*H01L 21/308* (2006.01)
*H01L 21/3213* (2006.01)

(52) U.S. Cl.
CPC ...... *H01L 21/3065* (2013.01); *H01L 21/3086* (2013.01); *H01L 21/32136* (2013.01); *H01L 21/32139* (2013.01)

(58) Field of Classification Search
None
See application file for complete search history.

(56) References Cited

U.S. PATENT DOCUMENTS

| | | |
|---|---|---|
| 6,329,106 B1 | 12/2001 | Bae et al. |
| 6,726,799 B2 | 4/2004 | Koike |
| 6,858,512 B2 | 2/2005 | Morimoto et al. |
| 6,884,730 B2 | 4/2005 | Sasaki et al. |
| 7,001,482 B2 | 2/2006 | Landis et al. |
| 7,329,362 B2 | 2/2008 | Cyrille et al. |
| 7,785,754 B2 | 8/2010 | Sim et al. |
| 9,118,001 B2 | 8/2015 | Godet et al. |

(Continued)

FOREIGN PATENT DOCUMENTS

| | | |
|---|---|---|
| JP | 3388228 B2 | 3/2003 |
| JP | 2007-511089 A | 4/2007 |

(Continued)

*Primary Examiner* — Shamim Ahmed
(74) *Attorney, Agent, or Firm* — Harness, Dickey & Pierce, P.L.C.

(57) ABSTRACT

A method for forming a fine pattern includes forming line patterns and a connection pattern on a semiconductor substrate, the line patterns extending in a first direction and spaced apart from each other in a second direction intersecting the first direction, and the connection pattern connecting portions of the line patterns adjacent to each other in the second direction, and performing an ion beam etching process on the connection pattern. The ion beam etching process provides an ion beam in an incident direction parallel to a plane defined by the first direction and a third direction perpendicular to a top surface of the semiconductor substrate, and the incident direction of the ion beam is not perpendicular to the top surface of the semiconductor substrate.

20 Claims, 19 Drawing Sheets

(56) References Cited

U.S. PATENT DOCUMENTS

| | | |
|---|---|---|
| 9,577,183 B2 | 2/2017 | Kim et al. |
| 9,627,610 B2 | 4/2017 | Park et al. |
| 2015/0090583 A1* | 4/2015 | Kodaira ............ H01J 37/32357 204/192.34 |
| 2015/0125976 A1* | 5/2015 | Wang ................ H01L 21/02381 438/26 |
| 2015/0168130 A1 | 6/2015 | Matsudo |
| 2016/0064232 A1* | 3/2016 | Berry, III .......... H01J 37/32009 438/712 |
| 2016/0064260 A1* | 3/2016 | Berry, III .......... H01L 21/67069 438/712 |
| 2019/0148109 A1* | 5/2019 | Yun .................. H01L 21/67213 156/345.55 |

FOREIGN PATENT DOCUMENTS

| | | |
|---|---|---|
| JP | 2008-304737 A | 12/2008 |
| JP | 6231370 B2 | 11/2017 |
| KR | 10-2015-0115209 A | 10/2015 |

* cited by examiner

METHOD FOR FORMING A FINE PATTERN

CROSS-REFERENCE TO RELATED APPLICATION

This U.S. non-provisional patent application claims priority under 35 U.S.C. § 119 to Korean Patent Application No. 10-2018-0021955, filed on Feb. 23, 2018, in the Korean Intellectual Property Office, the disclosure of which is hereby incorporated by reference in its entirety.

BACKGROUND

Example embodiments of the inventive concepts relate to a method for forming a fine pattern of a semiconductor device and, more particularly, to a method for forming a fine pattern by using an ion beam etching process.

A semiconductor device may include fine patterns for realizing a semiconductor integrated circuit (IC). Generally, photoresist patterns may be formed on a lower layer, and then, the lower layer may be etched using the photoresist patterns as etch masks to form patterns of a semiconductor device.

Meanwhile, as design rules of semiconductor devices have been rapidly reduced, aspect ratios of photoresist patterns have been increased. Thus, the photoresist patterns may lean or collapse. Thicknesses of the photoresist patterns may be reduced to allow the photoresist patterns to have fine widths while reducing or preventing the photoresist patterns from leaning or collapsing. However, it may be difficult to form fine patterns using the photoresist patterns having the reduced thicknesses as etch masks.

SUMMARY

Example embodiments of the inventive concepts may provide a method for forming a fine pattern, which is capable of reducing or minimizing pattern defects.

In an aspect, a method for forming a fine pattern may include forming line patterns and a connection pattern on a semiconductor substrate, the line patterns extending in a first direction and spaced apart from each other in a second direction intersecting the first direction, and the connection pattern connecting portions of the line patterns adjacent to each other in the second direction, and performing an ion beam etching process on the connection pattern. The ion beam etching process may provide an ion beam in an incident direction parallel to a plane defined by the first direction and a third direction perpendicular to a top surface of the semiconductor substrate, and the incident direction of the ion beam may not be perpendicular to the top surface of the semiconductor substrate.

In an aspect, a method for forming a fine pattern may include sequentially forming a lower layer and an organic mask layer on a semiconductor substrate, forming a hard mask pattern on the organic mask layer, the hard mask pattern including first line portions extending in parallel in a first direction and a first connection portion between the first line portions adjacent to each other, anisotropically etching the organic mask layer using the hard mask pattern as an etch mask to form an organic mask pattern which includes second line portions under the first line portions of the hard mask pattern and a second connection portion under the first connection portion of the hard mask pattern, and selectively ion-beam-etching the second connection portion of the organic mask pattern. The ion-beam-etching of the second connection portion may include irradiating an ion beam in an incident direction which is parallel to a plane defined by the first direction and a second direction perpendicular to a top surface of the semiconductor substrate, and the incident direction of the ion beam may not be perpendicular to the top surface of the semiconductor substrate.

BRIEF DESCRIPTION OF THE DRAWINGS

The inventive concepts will become more apparent in view of the attached drawings and accompanying detailed description.

DETAILED DESCRIPTION OF EXAMPLE EMBODIMENTS

Methods for forming a fine pattern according to some example embodiments of the inventive concepts will be described in detail with reference to the accompanying drawings.

Figure 1:
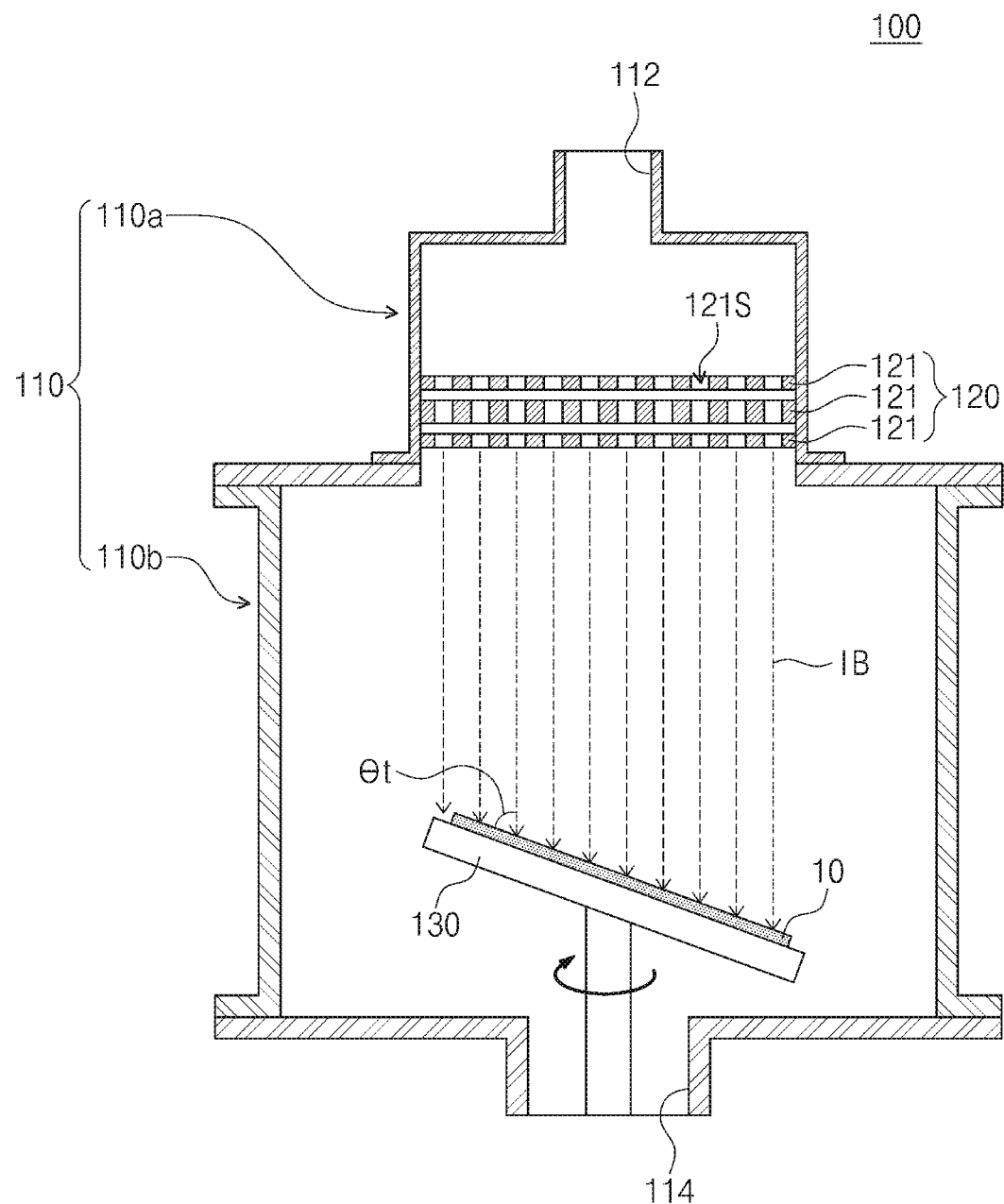
FIG. 1 is a schematic view illustrating an ion beam etching apparatus used in a method for forming a fine pattern, according to some example embodiments of the inventive concepts.

FIG. 1 is a schematic view illustrating an ion beam etching apparatus used in a method for forming a fine pattern, according to some example embodiments of the inventive concepts.

Referring to FIG. 1, an ion beam etching apparatus 100 may include a process chamber 110 including an ion beam source part 110a and a process part 110b, a gas inlet port 112 for supplying a reaction gas (or a process gas) used in an etching process, a grid 120 installed between the ion beam source part 110a and the process part 110b to extract an ion beam from plasma, a chuck assembly 130 installed in the process part 110b to fix and support a semiconductor substrate 10, and a gas exhaust port 114 for exhausting a gas in the process chamber 110. The grid 120 may include a plurality of electrode plates 121 vertically overlapping with each other, and each of the electrode plates 121 may have a plurality of slits 121S penetrating each of the electrode plates 121.

In addition, the ion beam etching apparatus 100 may further include a radio-frequency (or high-frequency) power source (not shown) for generating a magnetic field in the process chamber 110 and a direct current (DC) power source (not shown) for supplying direct currents, polarities and magnitudes of which are different from each other, to the grid 120.

A process gas may be supplied into the ion beam source part 110a through the gas inlet port 112, and the process gas may be ionized by the radio-frequency power source to generate plasma. In this state, the direct currents may be applied to the grid 120 to extract and accelerate an ion beam IB from the plasma. The ion beam IB may have a certain direction through the plurality of slits 121S and may be provided to the semiconductor substrate 10. The ion beam IB extracted and accelerated by the grid 120 may collide with the semiconductor substrate 10 to etch a layer or a portion of the semiconductor substrate 10.

The chuck assembly 130 fixing and supporting the semiconductor substrate 10 may be disposed to be inclined with respect to an incident direction of the ion beam IB. In other words, the chuck assembly 130 may be controlled such that an incidence angle θt of the ion beam IB with respect to a top surface of the semiconductor substrate 10 ranges from 0 degree to 90 degrees.

Figure 2:
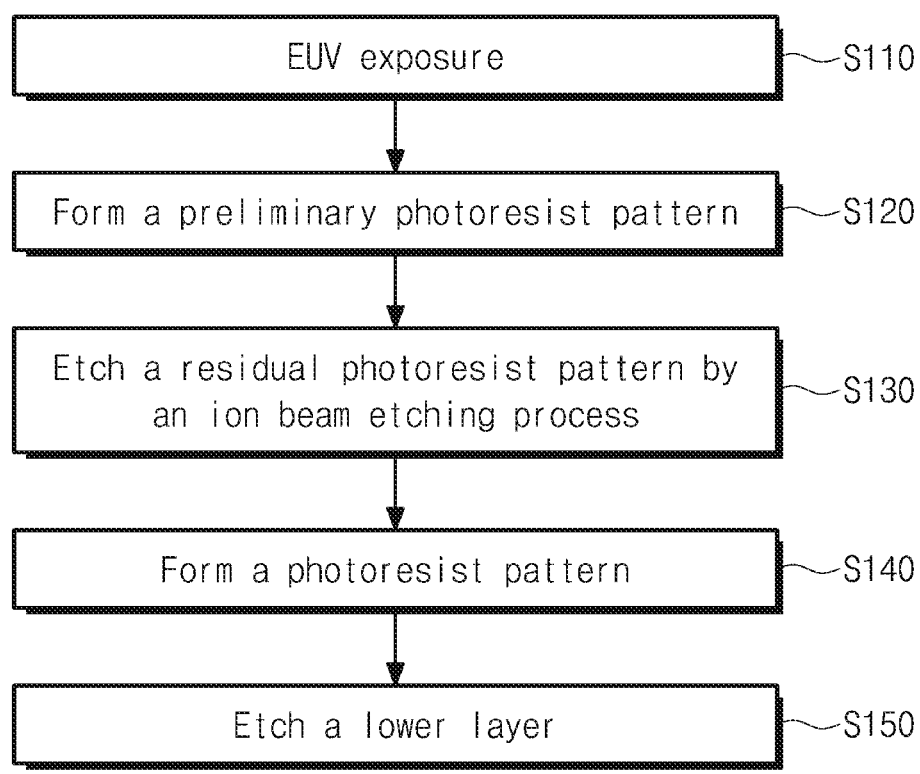
FIG. 2 is a flowchart illustrating a method for forming a fine pattern, according to some example embodiments of the inventive concepts.

FIG. 2 is a flowchart illustrating a method for forming a fine pattern, according to some example embodiments of the inventive concepts. FIGS. 3, 4, 5A, 5B and 6 to 8 are perspective views illustrating a method for forming a fine pattern, according to some example embodiments of the inventive concepts.

Figure 3:
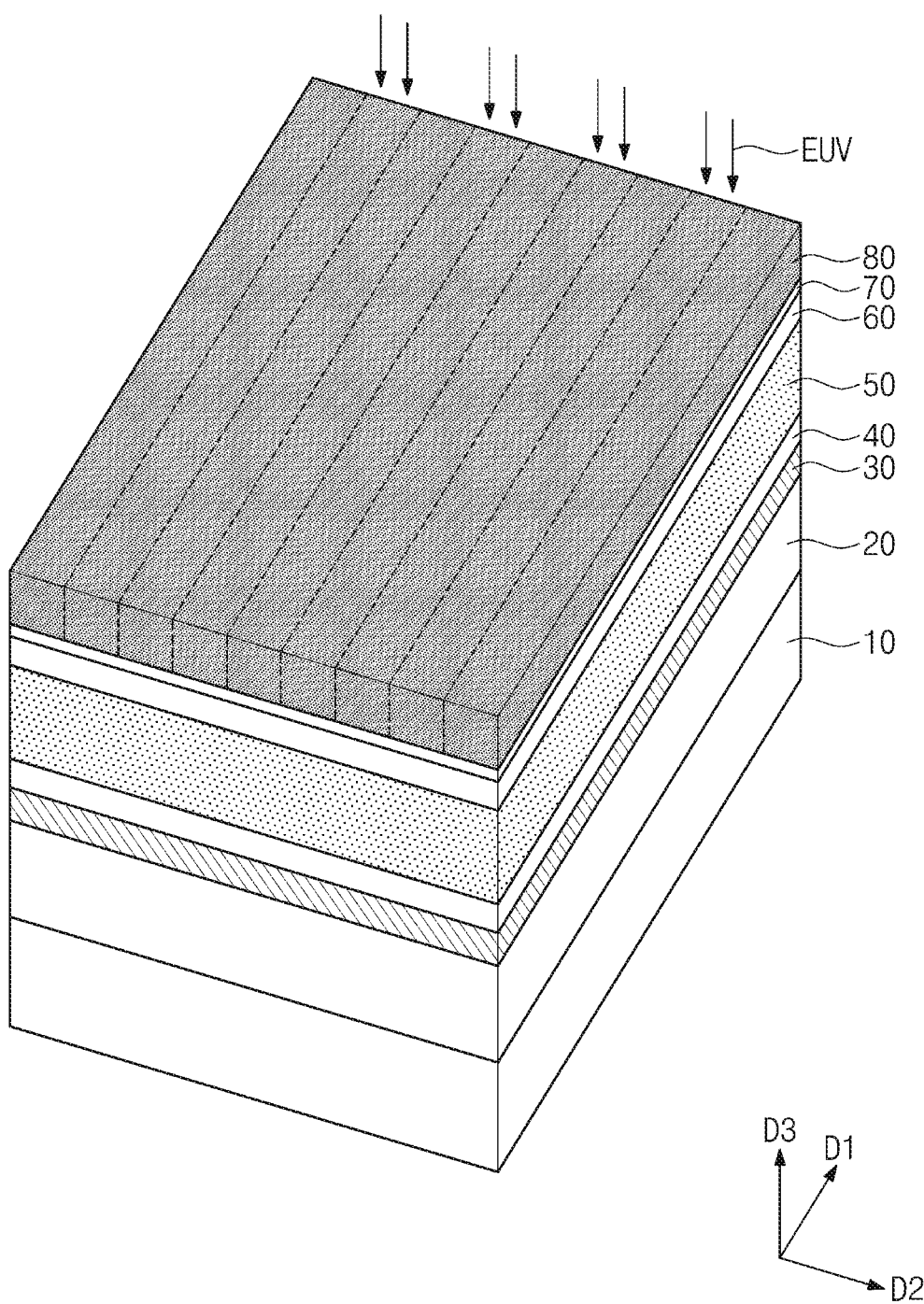
FIGS. 3, 4, 5A, 5B and 6 to 8 are perspective views illustrating a method for forming a fine pattern, according to some example embodiments of the inventive concepts.

Referring to FIG. 3, a lower layer 20, an etch stop layer 30, a first hard mask layer 40, an organic mask layer 50, a second hard mask layer 60 and/or an anti-reflection layer 70 may be sequentially formed on a semiconductor substrate 10.

For example, the semiconductor substrate 10 may be a silicon substrate, a germanium substrate, a silicon-on-insulator (SOI) substrate, or a germanium-on-insulator (GOI) substrate.

The lower layer 20 may be a single layer or a stack layer including a plurality of stacked layers. For example, the lower layer 20 may include a plurality of stacked insulating layers and may include conductive patterns and/or semiconductor patterns between the insulating layers.

The etch stop layer 30 may be formed of a material having an etch selectivity with respect to the lower layer 20 and the first hard mask layer 40. For example, the etch stop layer 30 may include at least one of a titanium (Ti) layer, a tantalum (Ta) layer, a tungsten (W) layer, a titanium oxide ($TiO_2$) layer, a titanium nitride (TiN) layer, a tantalum nitride (TaN) layer, or a tungsten nitride (WN) layer.

The first and second hard mask layers 40 and 60 may be formed of a material having an etch selectivity with respect to the lower layer 20 and the organic mask layer 50. For example, each of the first and second hard mask layers 40 and 60 may include one selected from a group consisting of poly-silicon, silicon-containing materials (e.g., $SiO_2$, SiON, $Si_3N_4$, SiCN, and SiC), and any combination thereof.

The organic mask layer 50 may be formed of an organic material having an etch selectivity with respect to the first and second hard mask layers 40 and 60. The organic mask layer 50 may be thicker than the first and second hard mask layers 40 and 60. For example, the organic mask layer 50 may be formed of at least one of a spin-on-hardmask (SOH) layer, a spin-on-carbon (SOC) layer, or an amorphous carbon layer (ACL). The SOH layer may include a carbon-based SOH layer or a silicon-based SOH layer.

The anti-reflection layer 70 may be formed of a material which improves an adhesive property of a photoresist layer 80 formed thereon and absorbs light in an exposure process performed on the photoresist layer 80 to reduce or prevent reflection of light. The anti-reflection layer 70 may include an organic polymer, for example, a novolac-based organic polymer.

Subsequently, the photoresist layer 80 may be formed on the anti-reflection layer 70 by a spin-coating method. The photoresist layer 80 may include a photosensitive compound and a synthetic resin.

Referring to FIGS. 2 and 3, an exposure process using extreme ultraviolet (EUV) may be performed on the photoresist layer 80 (S110). A reticle for forming line and space patterns may be used in the exposure process using the EUV. The photoresist layer 80 may include exposure regions to which the EUV is incident, and non-exposure regions to which the EUV is not incident.

In more detail, the EUV may have a wavelength of about 13.5 nm in the exposure process, and thus patterns of a fine pitch may be realized. According to some example embodiments, in the exposure process using the EUV, the photoresist layer 80 may react with the EUV in the exposure region but may not react with the EUV in the non-exposure region. Meanwhile, a portion of the photoresist in the exposure region may not sufficiently react with the EUV in the exposure process.

Figure 4:
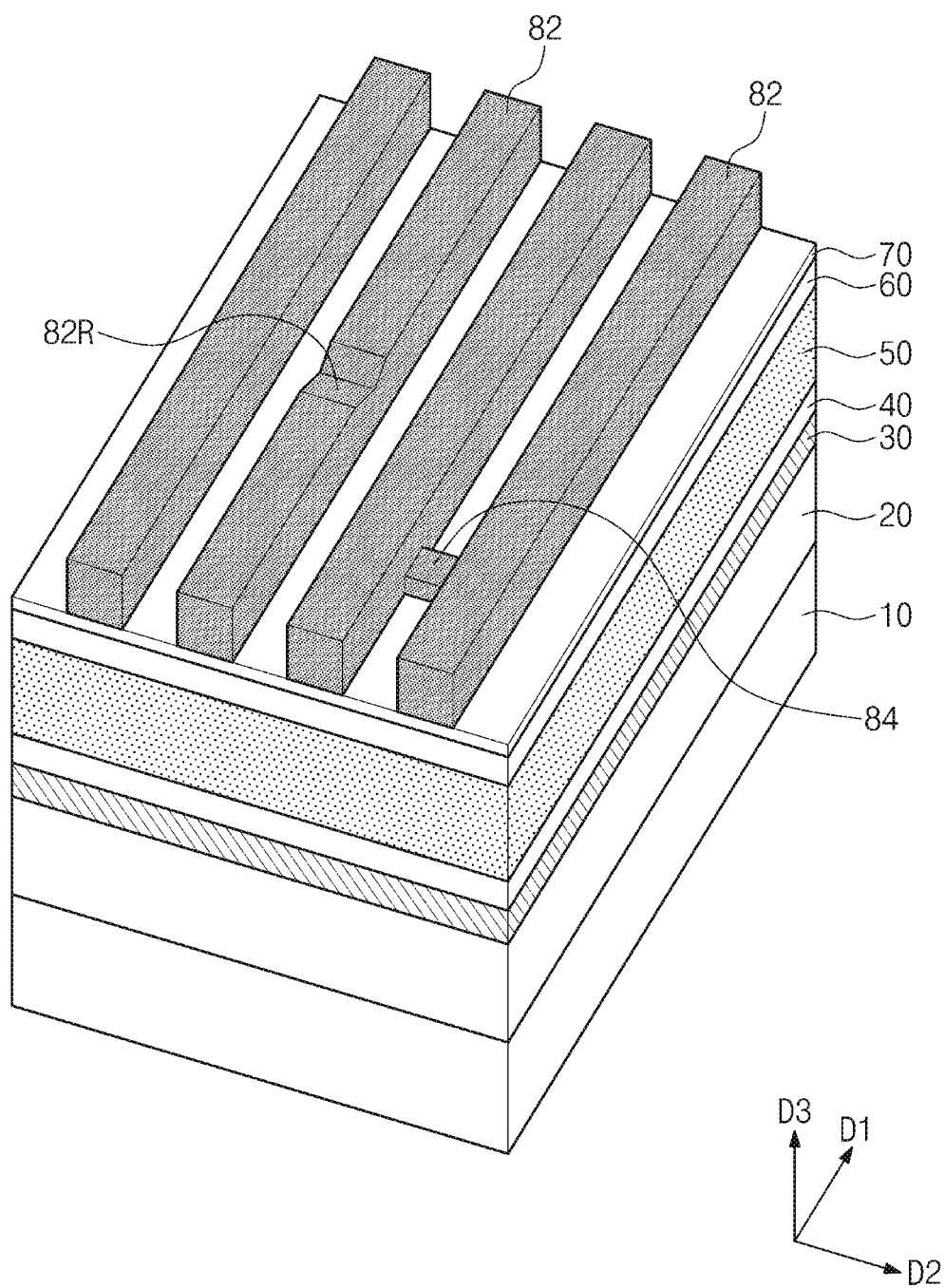

Referring to FIGS. 2 and 4, the photoresist layer 80 exposed to the EUV may be developed to form a preliminary photoresist pattern 82 and 84 on the anti-reflection layer 70 (S120).

The preliminary photoresist pattern 82 and 84 may include line photoresist patterns 82 extending in a first direction D1 and spaced apart from each other at certain (e.g., equal) intervals in a second direction D2, and a residual photoresist pattern 84 remaining between the line photoresist patterns 82 adjacent to each other.

The residual photoresist pattern 84 may be a photoresist scum which does not sufficiently react with the EUV in the exposure region of the photoresist layer 80 and thus remains between the line photoresist patterns 82 after the development process. The residual photoresist pattern 84 may connect portions of the line photoresist patterns 82 adjacent to each other in the second direction D2. Alternatively, the residual photoresist pattern 84 may locally remain in the form of an island between the line photoresist patterns 82 adjacent to each other in the second direction D2. In some example embodiments, a height H1 of the residual photoresist pattern 84 may be less than a height H2 of the line photoresist pattern 82 (H1<H2), as illustrated in FIG. 5A.

In addition, a defect may occur in the exposure process using the EUV, and thus at least one of the line photoresist patterns 82 may include a recessed portion 82R at its top surface. In other words, a height of a portion of the at least one of the line photoresist patterns 82 may be reduced.

Figure 5A:
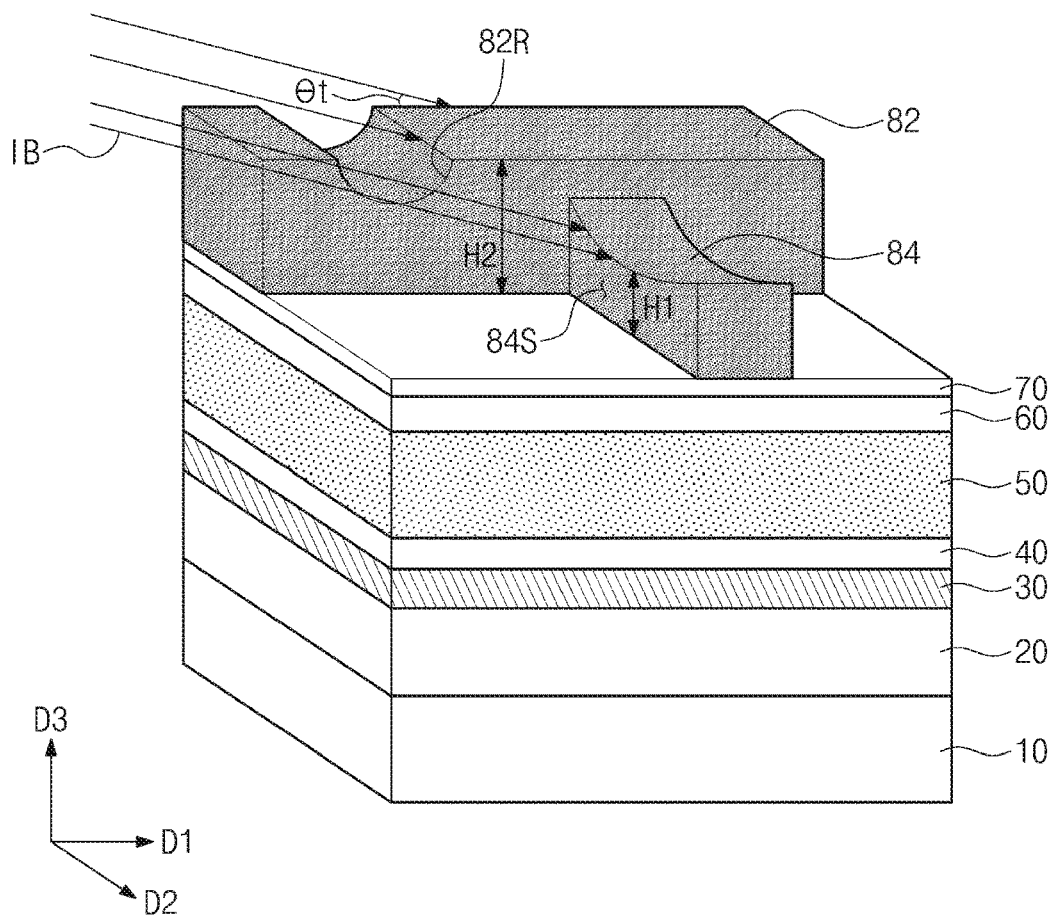
Figure 5B:
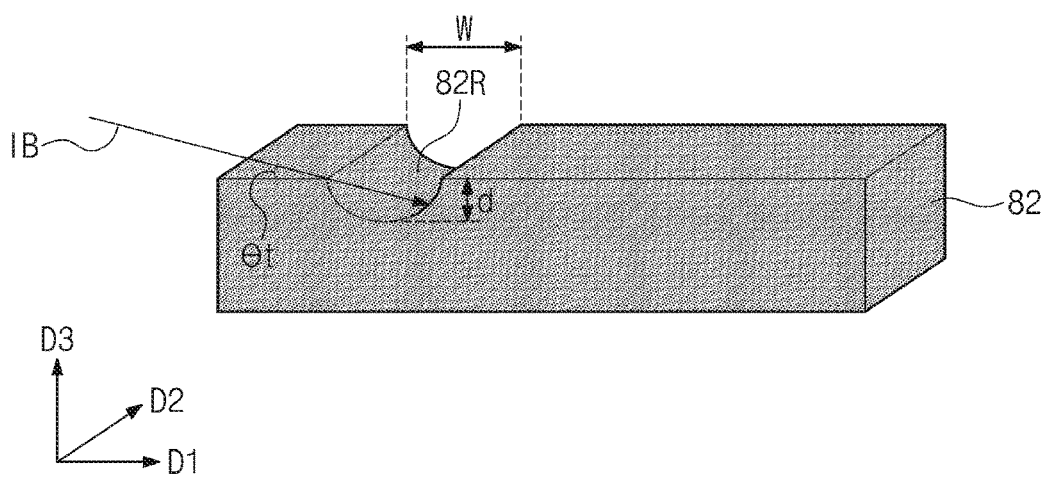

Referring to FIGS. 2, 5A and 5B, an ion beam etching process may be performed to remove the residual photoresist pattern 84 (S130).

The ion beam etching process may be performed using the ion beam etching apparatus 100 described with reference to FIG. 1. According to some example embodiments of the inventive concepts, in the ion beam etching process, the ion beam IB may be incident toward a sidewall 84S of the residual photoresist pattern 84 in an incident direction parallel to a plane defined by the first direction D1 and a third direction D3 perpendicular to a top surface of the semiconductor substrate 10. Here, the sidewall 84S of the residual photoresist pattern 84, to which the ion beam IB is incident, may not be parallel to sidewalls of the line photoresist patterns 82. The ion beam IB incident at an incidence angle θt with respect to the first direction D1 may collide with the residual photoresist pattern 84 to selectively etch the residual photoresist pattern 84.

In the ion beam etching process, the ion beam IB may be irradiated in the incident direction parallel to the plane defined by the first and third directions D1 and D3 and may be irradiated at the incidence angle θt with the top surface of the semiconductor substrate 10. The incidence angle θt may be an angle between the top surface of the semiconductor substrate 10 and the incident direction of the ion beam IB. The incidence angle θt of the ion beam IB may be selected from a range in which a depth d of the recessed portion 82R of the line photoresist pattern 82 is not increased. The incidence angle θt of the ion beam IB may be determined depending on a width W of the recessed portion 82R in the first direction D1 and the depth d of the recessed portion 82R. Here, the incident direction of the ion beam IB may not be perpendicular to the top surface of the semiconductor substrate 10. For example, the incidence angle θt of the ion beam IB may be greater than 0 degree and less than 90 degrees. In more detail, the incidence angle θt of the ion beam IB may be selected from a range of about 15 degrees to about 80 degrees with respect to the top surface of the semiconductor substrate 10 to reduce or minimize reduction in the height H2 of the line photoresist pattern 82. Since the incidence angle θt of the ion beam IB is improved or optimized in the example embodiments, the residual photoresist pattern 84 may be selectively etched while maintaining predetermined (or alternatively, desired) thicknesses of the line photoresist patterns 82 on the anti-reflection layer 70.

Figure 6:
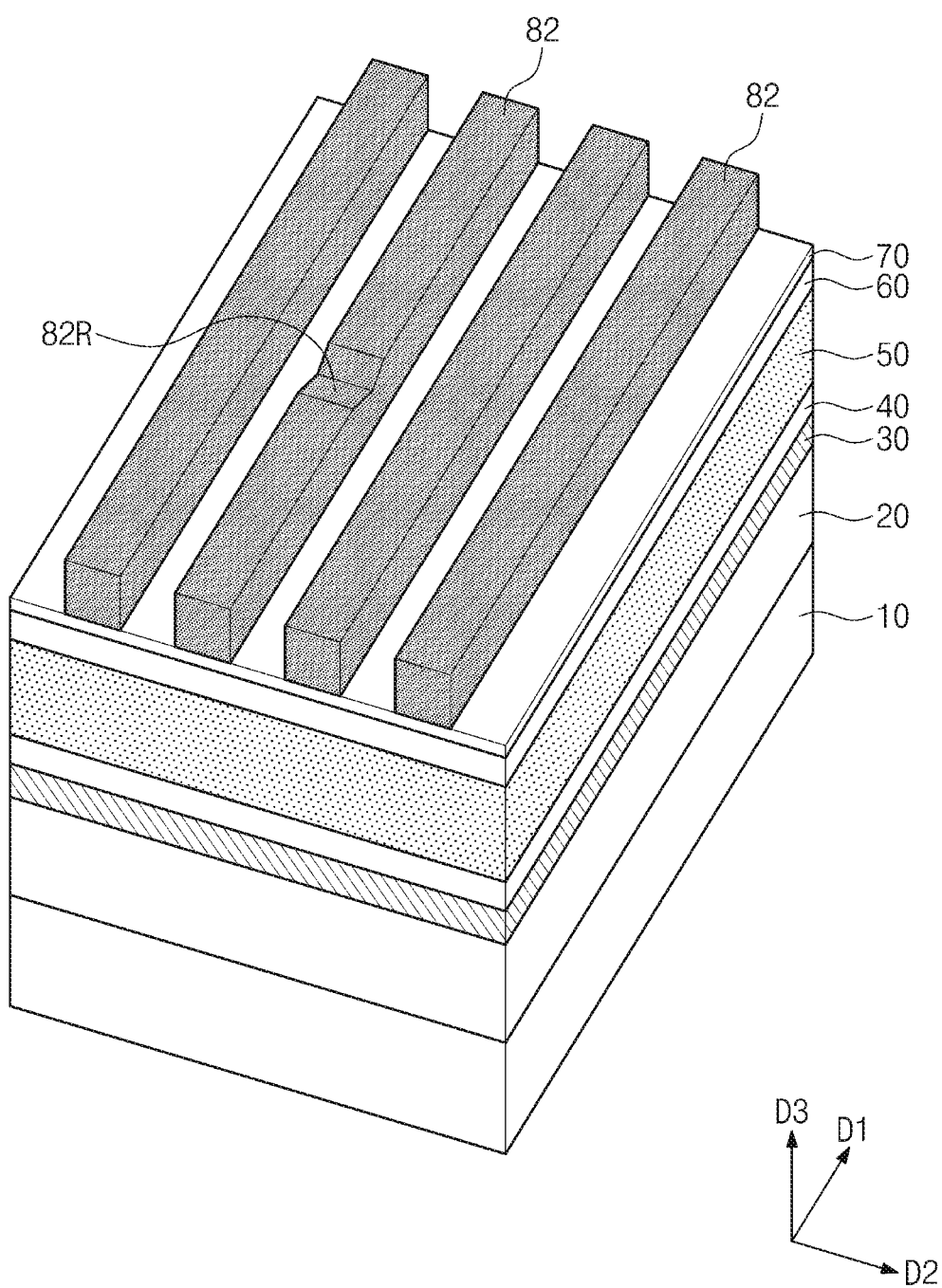

Referring to FIGS. 2 and 6, the residual photoresist pattern 84 may be removed by the ion beam etching process to expose the anti-reflection layer 70 between the line photoresist patterns 82 adjacent to each other. Thus, a photoresist pattern which has the line photoresist patterns 82 without the residual photoresist pattern 84 may be formed (S140).

Figure 7:
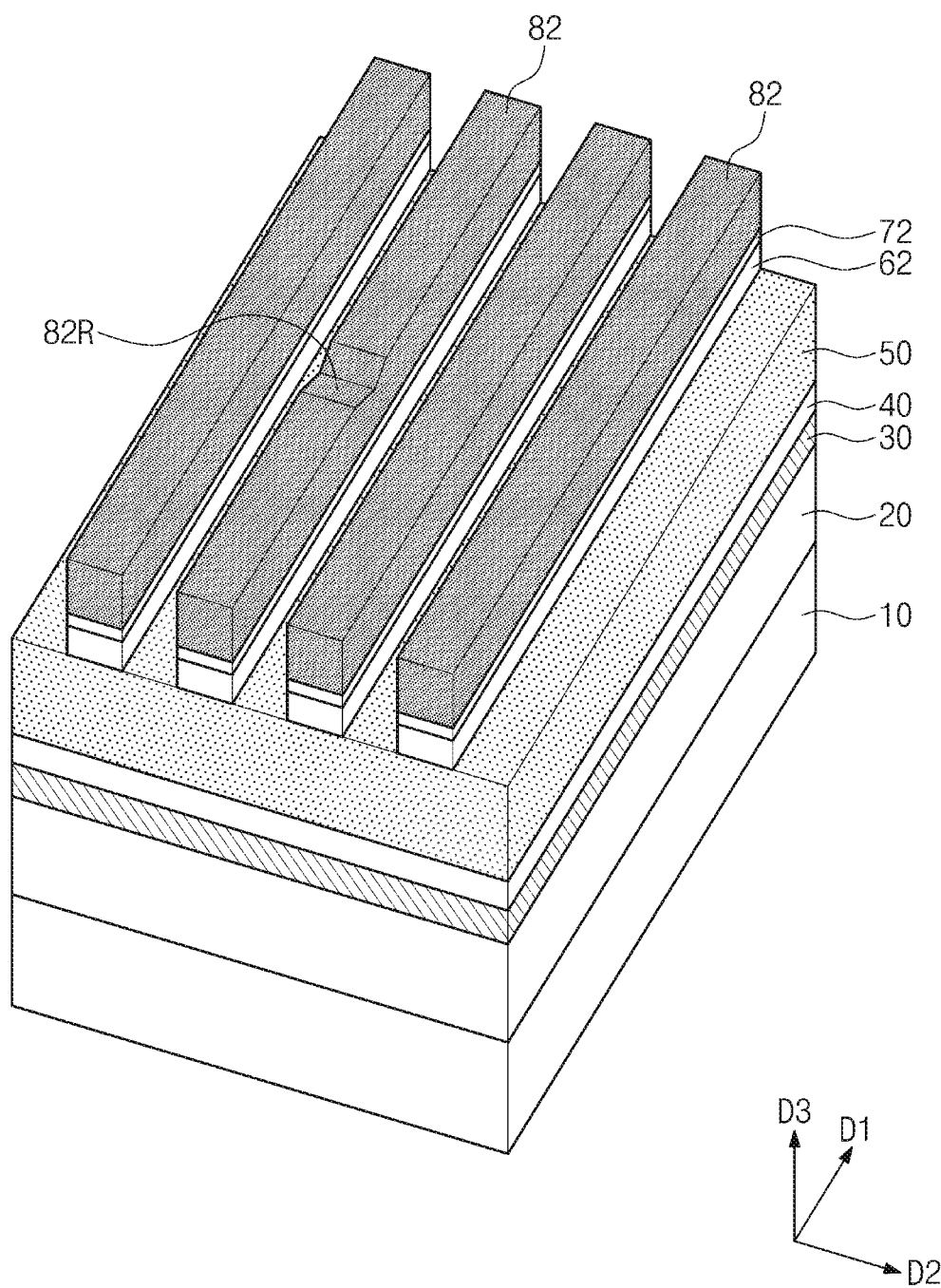
Figure 8:
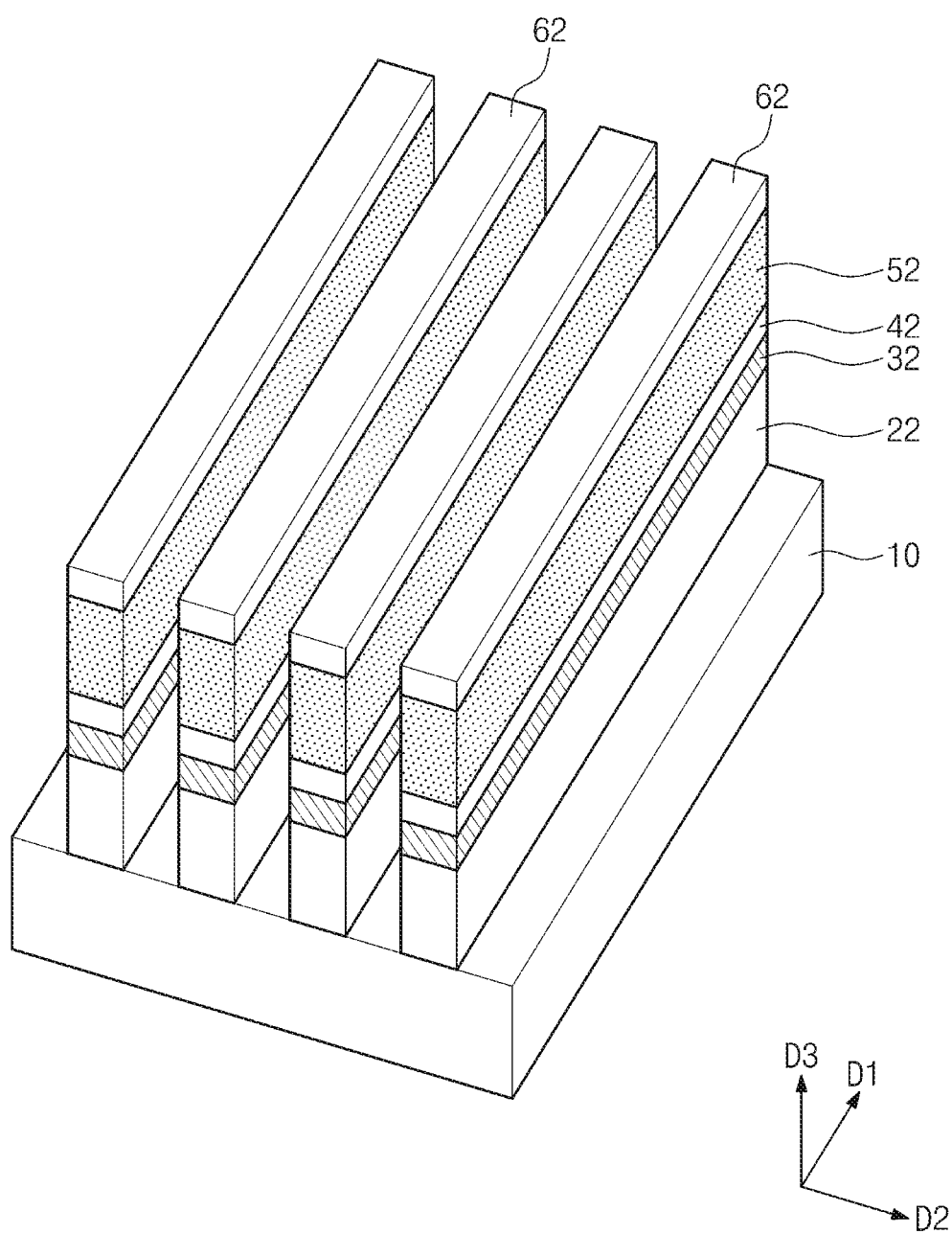

Referring to FIGS. 2, 7 and 8, an anisotropic etching process may be performed on the anti-reflection layer 70 and the second hard mask layer 60 by using the line photoresist patterns 82 as etch masks. Thus, second hard mask patterns 62 and anti-reflection patterns 72 may be formed on the organic mask layer 50. The second hard mask patterns 62 and the anti-reflection patterns 72 may have line shapes extending in the first direction D1.

After the formation of the second hard mask patterns 62, the line photoresist patterns 82 and the anti-reflection patterns 72 may be removed by an ashing process and/or a stripping process.

Next, a primary anisotropic etching process may be performed on the organic mask layer 50 and the first hard mask layer 40 by using the second hard mask patterns 62 as etch masks. The primary anisotropic etching process may use an etch recipe having an etch selectivity with respect to the etch stop layer 30. First hard mask patterns 42 and organic mask patterns 52 may be formed on the etch stop layer 30 by the primary anisotropic etching process. According to some example embodiments, the second hard mask patterns 62 may be removed during the primary anisotropic etching process performed on the organic mask layer 50.

Subsequently, a secondary anisotropic etching process may be performed on the etch stop layer 30 and the lower layer 20 by using the first hard mask patterns 42 and the organic mask patterns 52 as etch masks (S150). The secondary anisotropic etching process may use an etch recipe having an etch selectivity with respect to the semiconductor substrate 10. Thus, lower patterns 22 and etch stop patterns 32, which have line shapes, may be formed on the semiconductor substrate 10. According to some example embodiments, heights of the organic mask patterns 52 may be reduced during the formation of the lower patterns 22.

The organic mask patterns 52 and the first hard mask patterns 42 remaining on the lower patterns 22 may be removed after the formation of the lower patterns 22.

According to the example embodiments, the residual photoresist pattern 84 remaining between the line photoresist patterns 82 may be selectively etched by the ion beam IB, and then, the patterning process of the lower layer 20 may be performed. Thus, it is possible to reduce or prevent patterning failure in which portions of line-shaped lower patterns 22 may be connected to each other and/or at least one of the lower patterns 22 may be broken in the first direction D1.

Figure 9:
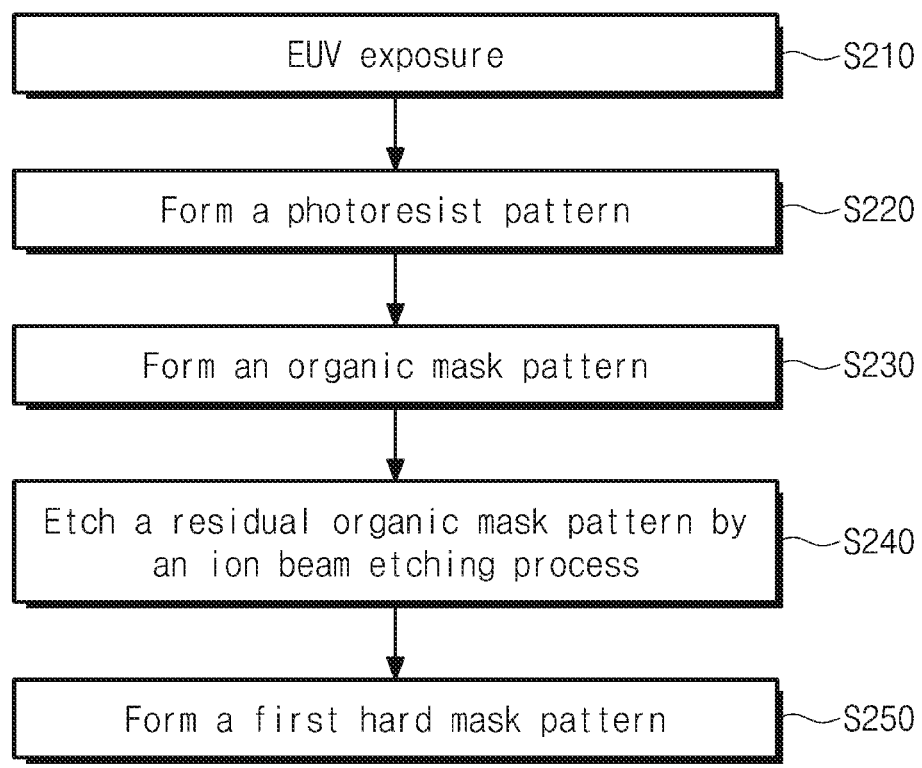
FIG. 9 is a flowchart illustrating a method for forming a fine pattern, according to some example embodiments of the inventive concepts.

FIG. 9 is a flowchart illustrating a method for forming a fine pattern, according to some example embodiments of the inventive concepts. FIGS. 10 to 14 are perspective views illustrating a method for forming a fine pattern, according to some example embodiments of the inventive concepts. Hereinafter, the descriptions to the same technical features as in the above example embodiments of FIGS. 2 to 8 will be omitted or mentioned briefly for the purpose of ease and convenience in explanation.

Figure 10:
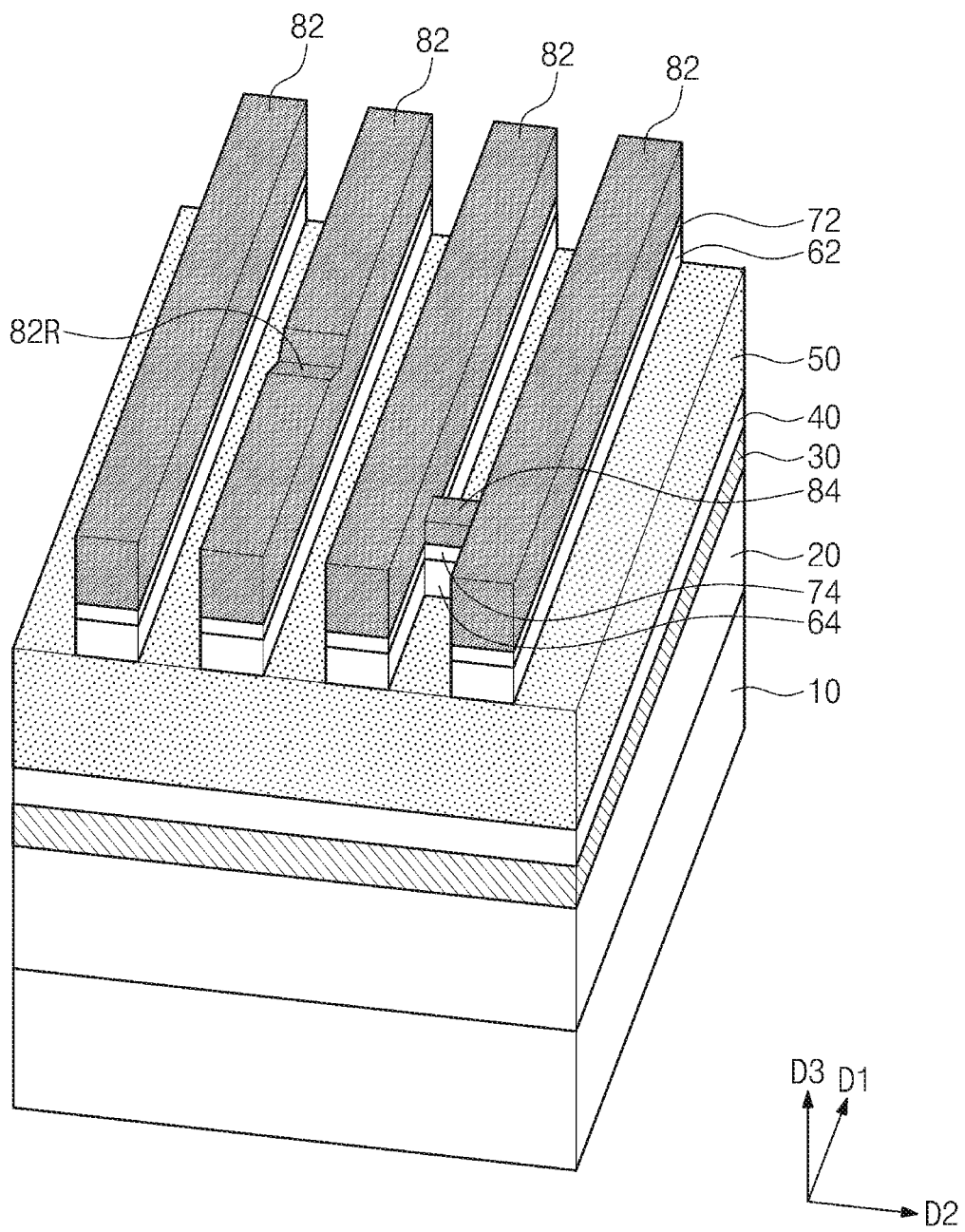
FIGS. 10 to 14 are perspective views illustrating a method for forming a fine pattern, according to some example embodiments of the inventive concepts.

Referring to FIGS. 9 and 10, the lower layer 20, the etch stop layer 30, the first hard mask layer 40, the organic mask layer 50, the second hard mask layer 60, the anti-reflection layer 70 and/or the photoresist layer 80 may be sequentially formed on the semiconductor substrate 10, as described above with reference to FIG. 3.

Next, an exposure process using extreme ultraviolet (EUV) may be performed on the photoresist layer 80 (S210), as described above with reference to FIG. 4. A reticle for forming line and space patterns may be used in the exposure process using the EUV.

Referring continuously to FIGS. 9 and 10, a development process may be performed on the exposed photoresist layer 80 to form a photoresist pattern 82 and 84 on the anti-reflection layer 70 (S220).

Like the preliminary photoresist pattern described above with reference to FIG. 4, the photoresist pattern 82 and 84 may include the line photoresist patterns 82 extending in the first direction D1 and spaced apart from each other at certain (e.g., equal) intervals in the second direction D2, and the residual photoresist pattern 84 connecting portions of the line photoresist patterns 82 adjacent to each other. In addition, at least one of the line photoresist patterns 82 may have the recessed portion 82R recessed from the top surface thereof.

Referring continuously to FIG. 10, an anisotropic etching process may be performed on the anti-reflection layer 70 and the second hard mask layer 60 by using the photoresist pattern 82 and 84 as an etch mask. Thus, a second hard mask pattern 62 and 64 and an anti-reflection pattern 72 and 74 which are sequentially stacked may be formed on the organic mask layer 50.

The anti-reflection pattern 72 and 74 may include first line portions 72 under the line photoresist patterns 82, and a first connection portion 74 under the residual photoresist pattern 84. The second hard mask pattern 62 and 64 may include second line portions 62 under the first line portions 72, and a second connection portion 64 under the first connection portion 74.

The photoresist pattern 82 and 84 and the anti-reflection pattern 72 and 74 may be removed after the formation of the second hard mask pattern 62 and 64.

Figure 11:
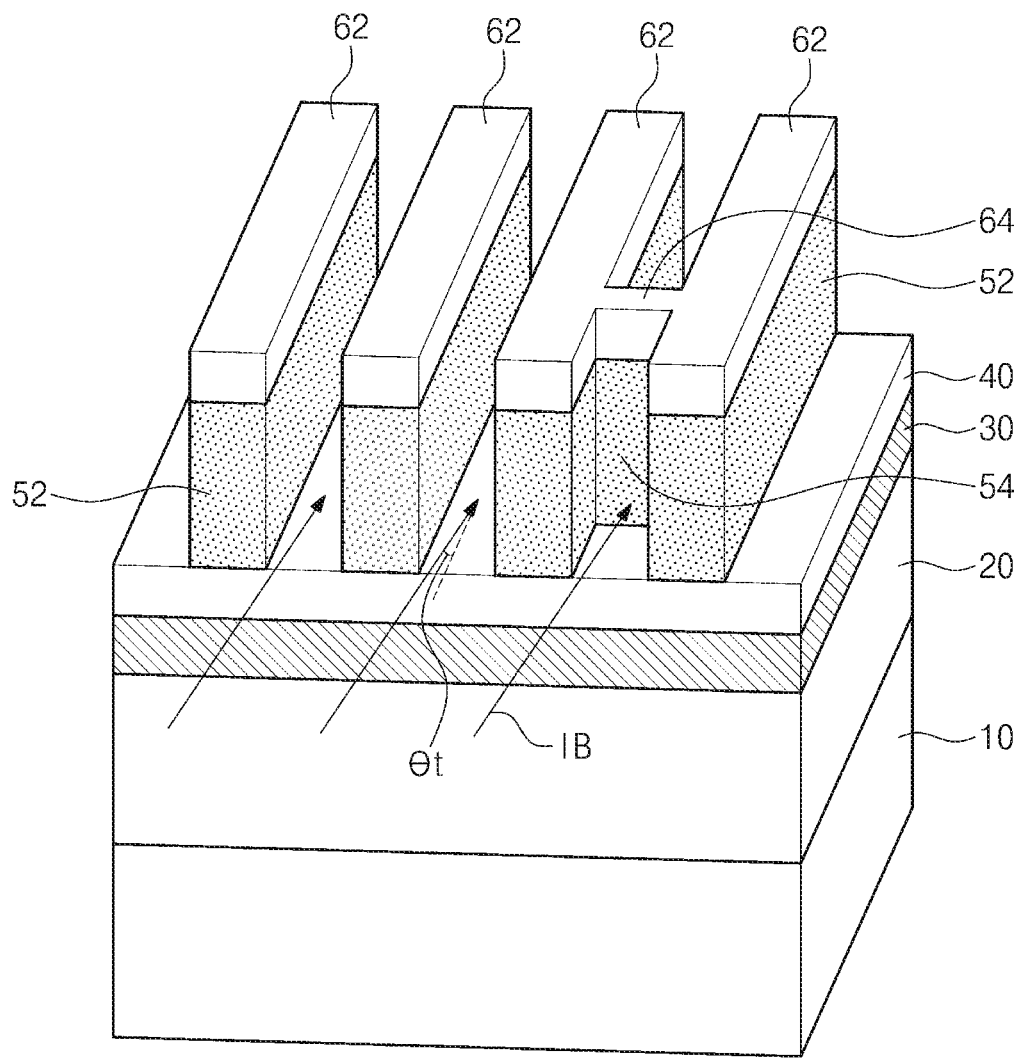
Figure 11:
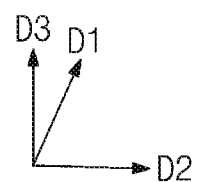

Referring to FIGS. 9 and 11, an anisotropic etching process may be performed on the organic mask layer 50 by using the second hard mask pattern 62 and 64 as an etch mask. Thus, an organic mask pattern 52 and 54 may be formed (S230).

The organic mask pattern 52 and 54 may include third line portions 52 extending in the first direction D1, and a third connection portion 54 connecting portions of the third line portions 52 adjacent to each other. The third line portions 52 may be formed under the second line portions 62 of the second hard mask pattern, and the third connection portion 54 may be formed under the second connection portion 64 of the second hard mask pattern. The third line portions 52 and the third connection portion 54 of the organic mask pattern may have substantially the same height.

Referring again to FIGS. 9 and 11, an ion beam etching process may be performed on the third connection portion 54 of the organic mask pattern (S240).

The ion beam etching process may use an etch recipe having an etch selectivity with respect to the first hard mask layer 40 and the second hard mask pattern 62 and 64. In addition, in the ion beam etching process, the ion beam IB may be incident toward a sidewall of the third connection portion 54 of the organic mask pattern.

Figure 12:
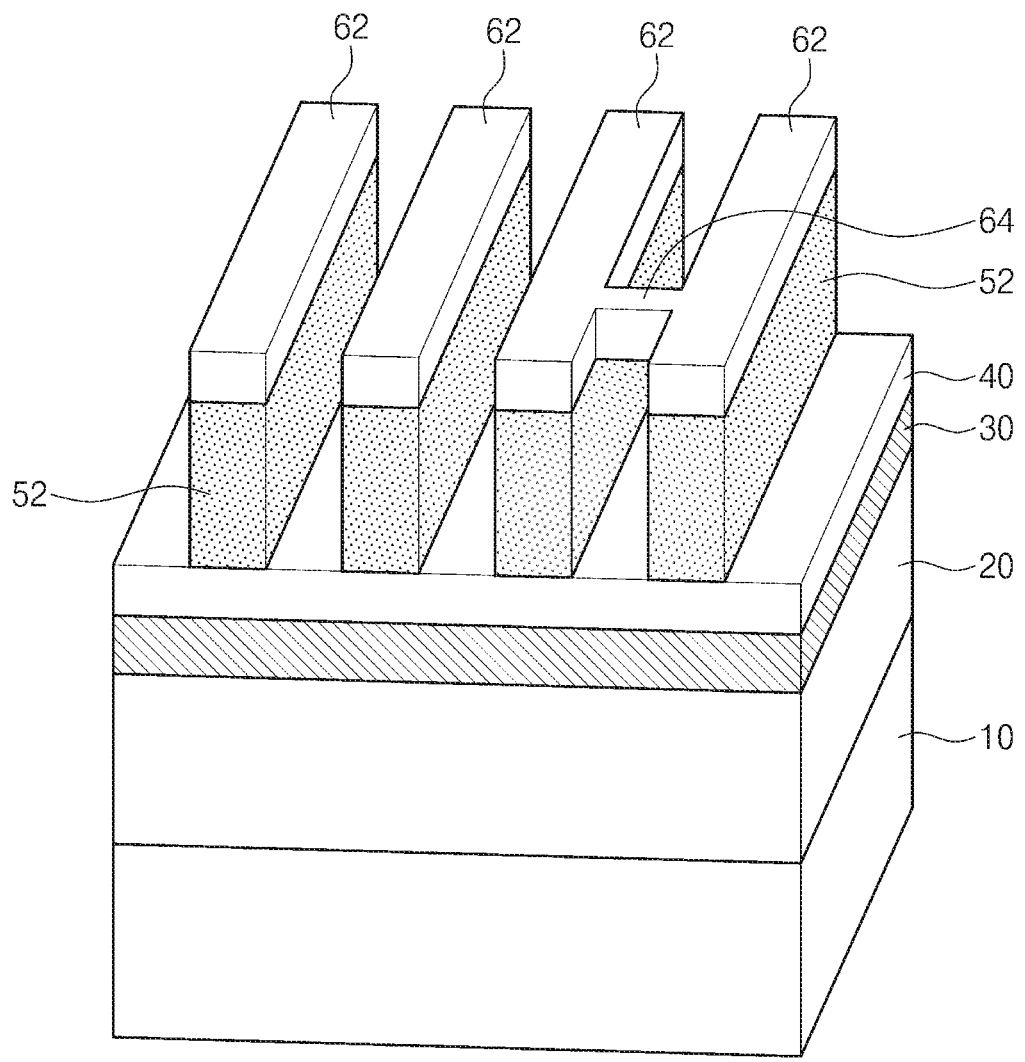
Figure 12:
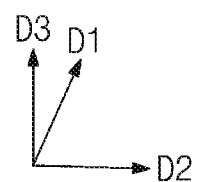

In the ion beam etching process, the ion beam IB may be provided to the semiconductor substrate 10 in an incident direction parallel to a plane defined by the first and third directions D1 and D3. In addition, the ion beam IB may be irradiated at an incidence angle θt with respect to the top surface of the semiconductor substrate 10. The incidence angle θt may be an angle between the top surface of the semiconductor substrate 10 and the incident direction of the ion beam IB. The incident direction of the ion beam IB may not be perpendicular to the top surface of the semiconductor substrate 10. The incidence angle θt of the ion beam IB may be greater than 0 degree and less than 90 degrees. In more detail, the incidence angle θt of the ion beam IB may be selected from a range of about 15 degrees to about 80 degrees with respect to the top surface of the semiconductor substrate 10. The incidence angle θt of the ion beam IB may be improved or optimized to selectively etch the third connection portion 54 of the organic mask pattern, as shown in FIG. 12. In addition, since the third line portions 52 of the organic mask pattern are covered by the second line portions 62 of the second hard mask pattern during the ion beam etching process, it is possible to reduce or prevent reduction in heights of the third line portions 52 of the organic mask pattern.

Since the ion beam etching process is performed on the third connection portion 54 of the organic mask pattern, a top surface of the first hard mask layer 40 may be exposed between the third line portions 52, and a bottom surface of the second connection portion 64 of the second hard mask pattern may also be exposed. In other words, an empty space may be formed between the second connection portion 64 of the second hard mask pattern and the first hard mask layer 40, and the second connection portion 64 of the second hard mask pattern may be vertically spaced apart from the first hard mask layer 40 and may be connected between the second line portions 62 of the second hard mask pattern, as shown in FIG. 12.

Figure 13:
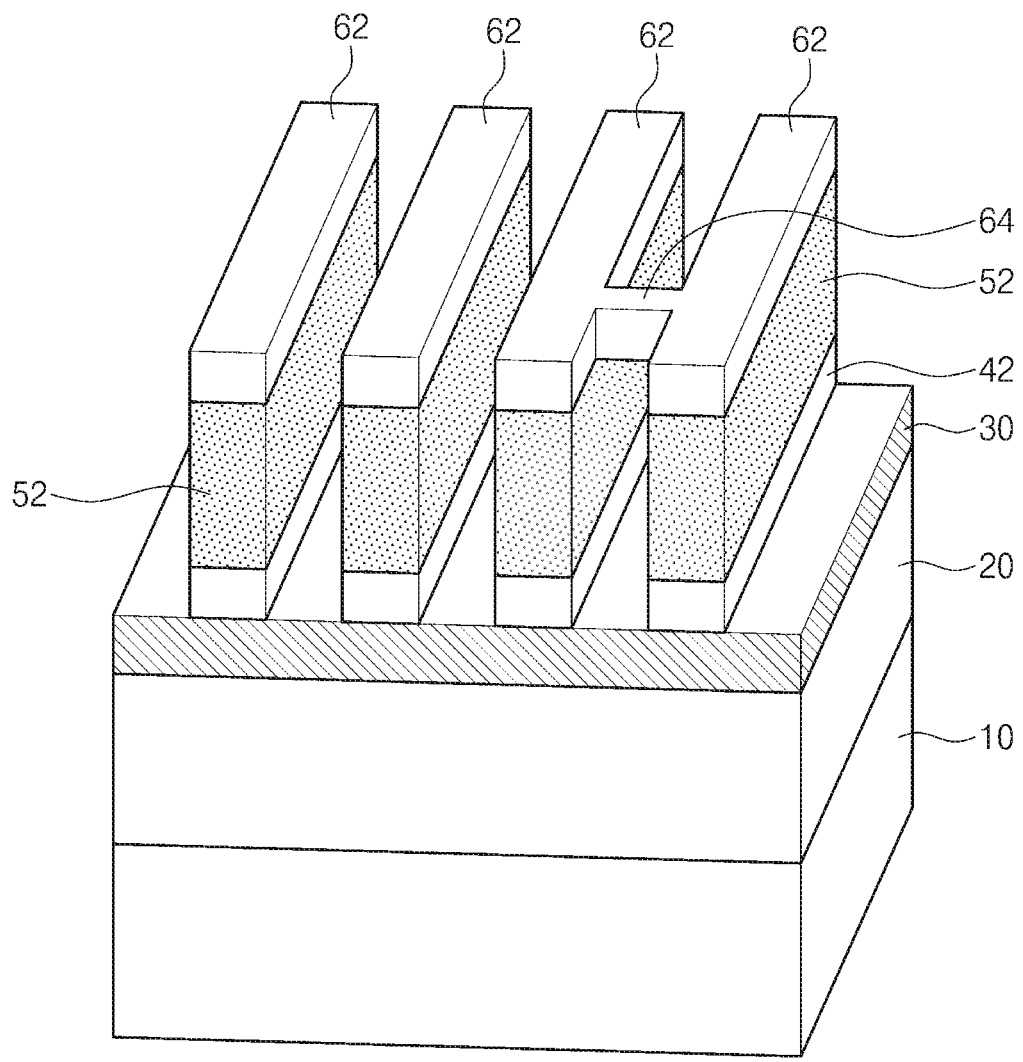
Figure 13:
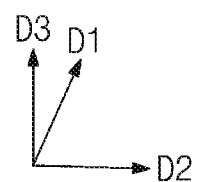

Referring to FIGS. 9 and 13, an anisotropic etching process may be performed on the first hard mask layer 40 by using the third line portions 52 of the organic mask pattern as etch masks. Thus, first hard mask patterns 42 may be formed (S250).

The etch stop layer 30 or the lower layer 20 may be exposed by the anisotropic etching process of forming the first hard mask patterns 42. The second hard mask pattern 62 and 64 may be removed during the formation of the first hard mask patterns 42. Alternatively, an additional etching process may be performed to remove the second hard mask pattern 62 and 64.

Figure 14:
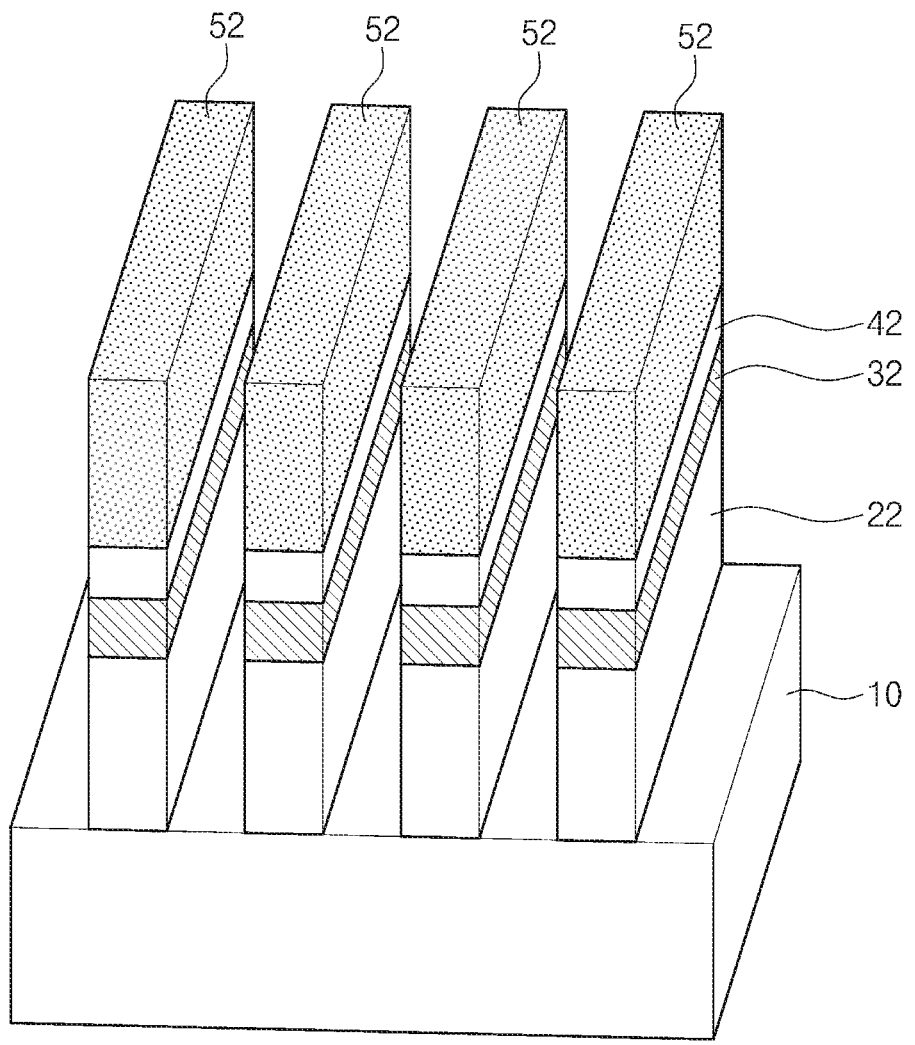
Figure 14:
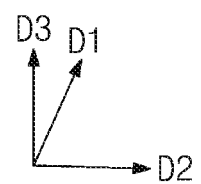

Referring to FIG. 14, an anisotropic etching process may be performed on the etch stop layer 30 and the lower layer 20 by using the organic mask patterns 52 and the first hard mask patterns 42 as etch masks. Thus, etch stop patterns 32 and lower patterns 22, which extend in the first direction D1, may be formed on the semiconductor substrate 10.

FIGS. 15 to 18 are perspective views illustrating a method for forming a fine pattern, according to some example embodiments of the inventive concepts. Hereinafter, the descriptions to the same technical features as in the above example embodiments of FIGS. 2 to 8 will be omitted or mentioned briefly for the purpose of ease and convenience in explanation.

Figure 15:
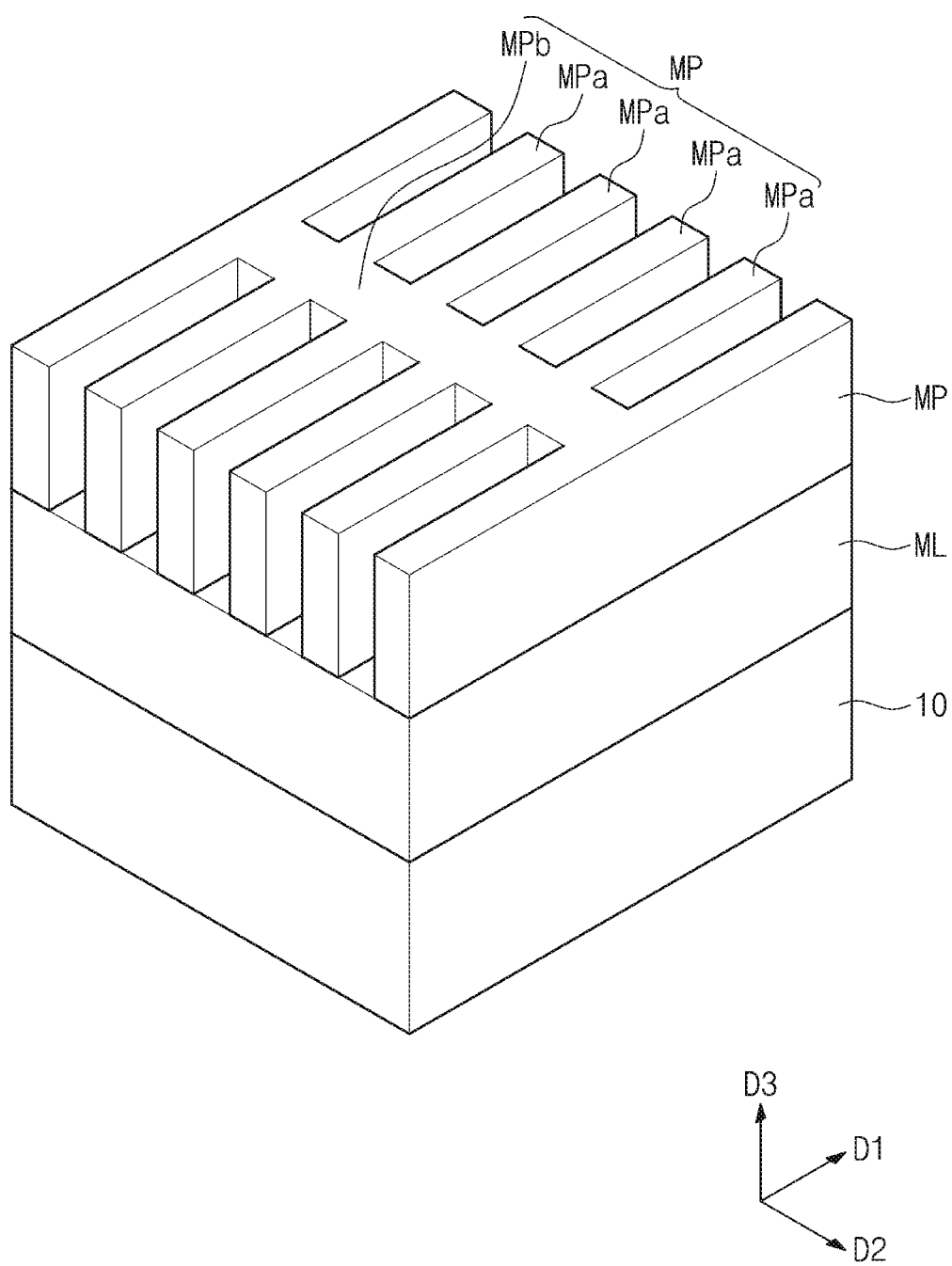
FIGS. 15 to 18 are perspective views illustrating a method for forming a fine pattern, according to some example embodiments of the inventive concepts.

Referring to FIG. 15, a mold layer ML may be formed on a semiconductor substrate 10. The mold layer ML may be a single layer or a stack layer including a plurality of stacked layers. For example, the mold layer ML may include a high-density plasma (HDP) oxide layer, a tetraethylorthosilicate (TEOS) layer, a plasma enhanced tetraethylorthosilicate (PE-TEOS) layer, an $O_3$-tetraethylorthosilicate ($O_3$-TEOS) layer, an undoped silicate glass (USG) layer, a phosphosilicate glass (PSG) layer, a borosilicate glass (BSG) layer, a borophosphosilicate glass (BPSG) layer, a fluoride silicate glass (FSG) layer, a spin on glass (SOG) layer, a Tonen silazene (TOSZ) layer, or any combination thereof. Alternatively, the mold layer ML may include a silicon nitride layer, a silicon oxynitride layer, or a low-k material layer having a low dielectric constant.

A mask pattern MP may be formed on the mold layer ML. The mask pattern MP may be formed of a material having an etch selectivity with respect to the mold layer ML. For example, the mask pattern MP may be a photoresist pattern, an organic mask pattern, or a hard mask pattern.

According to some example embodiments, the mask pattern MP may include line portions MPa extending in a first direction D1, and a connection portion MPb which extends in a second direction D2 intersecting the first direction D1 and connects the line portions MPa.

Figure 16:
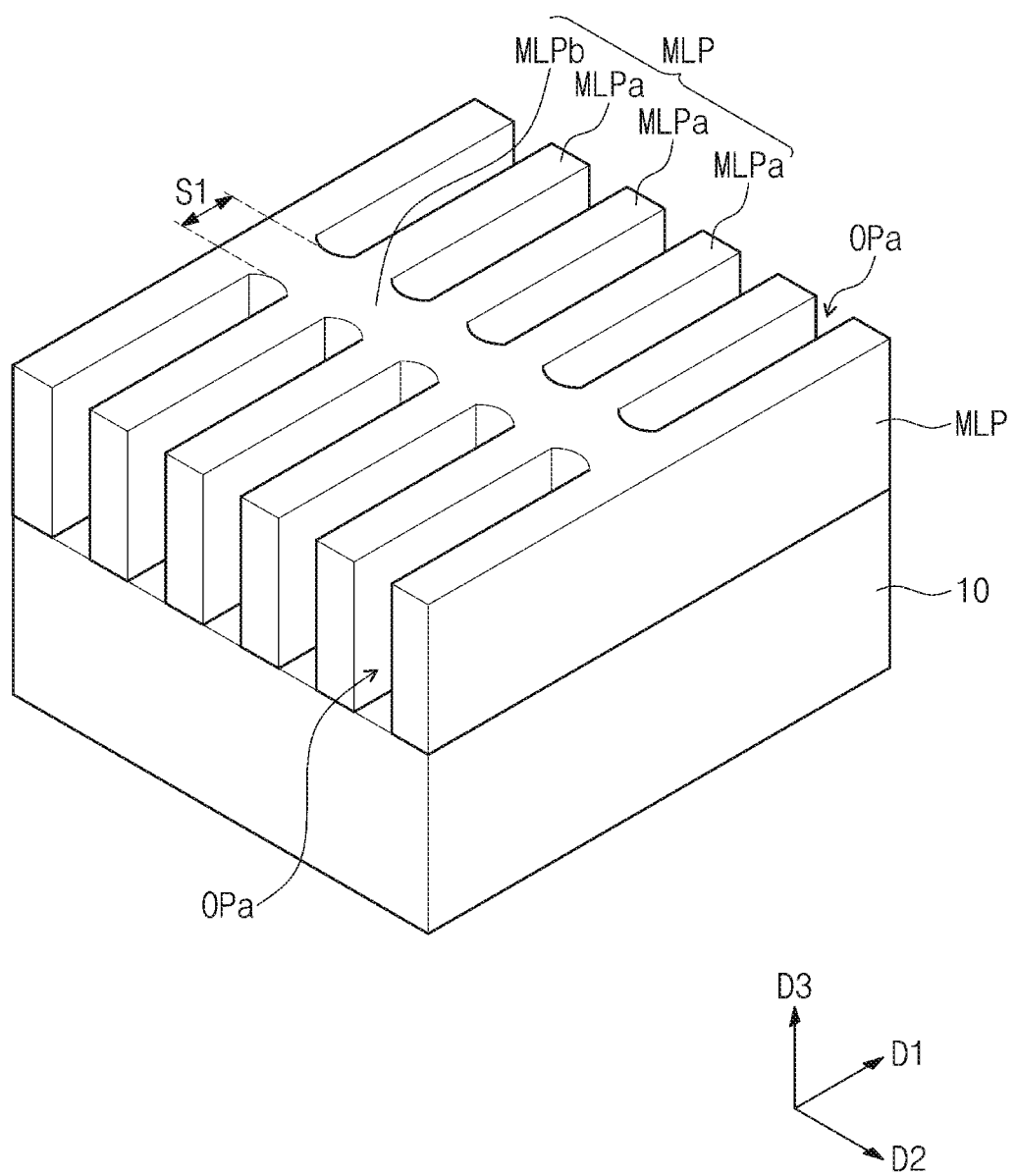

Referring to FIG. 16, an anisotropic etching process may be performed on the mold layer ML by using the mask pattern MP as an etch mask. Thus, a shape of the mask pattern MP may be transferred to the mold layer ML to form a mold pattern MLP. The mold pattern MLP may include line portions MLPa and a connection portion MLPb.

The mold pattern MLP may have preliminary openings OPa defined by the line portions MLPa and the connection portion MLPb. The preliminary openings OPa arranged in the first direction D1 may be spaced apart from each other in the first direction D1 by a first distance S1. The first distance 51 may correspond to a width of the connection portion MLPb of the mold pattern MLP.

Figure 17:
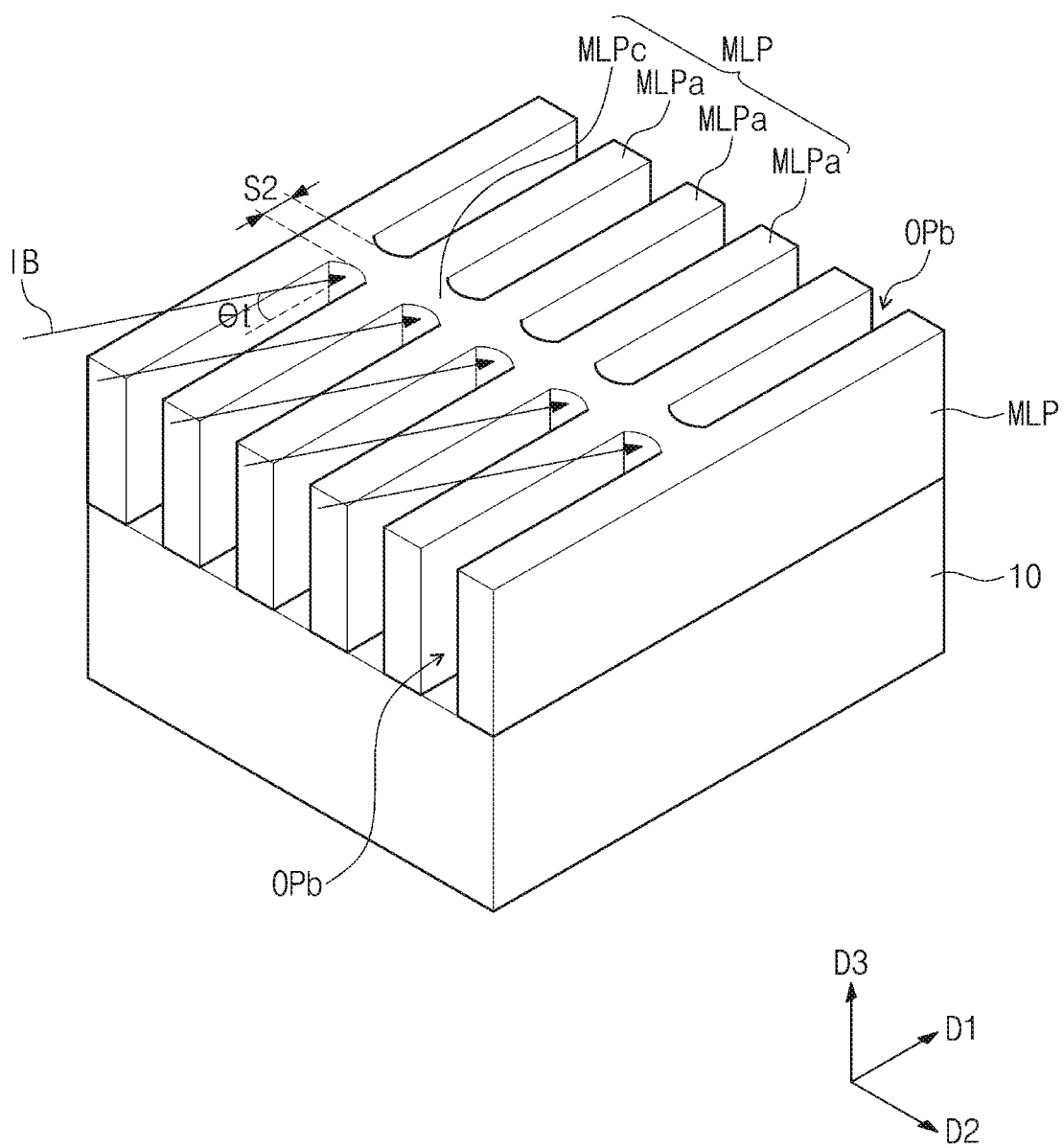

Referring to FIG. 17, an ion beam etching process may be performed on the connection portion MLPb of the mold pattern MLP. Here, the ion beam etching process may be performed using the ion beam etching apparatus 100 described with reference to FIG. 1. In the ion beam etching process, the ion beam IB may be irradiated to a sidewall of the connection portion MLPb of the mold pattern MLP, as described above with reference to FIGS. 5A and 5B. The ion beam IB may be irradiated in an incident direction which forms an incidence angle θt with a top surface of the semiconductor substrate 10 and is parallel to a plane defined by the first direction D1 and a third direction D3 perpendicular to the top surface of the semiconductor substrate 10. The incidence angle θt may be an angle between the top surface of the semiconductor substrate 10 and the incident direction of the ion beam IB. The incidence angle θt of the ion beam IB may be selected from a range of about 15 degrees to about 80 degrees with respect to the top surface of the semiconductor substrate 10 to reduce or minimize reduction in thickness of the mold pattern MLP in the ion beam etching process.

According to the example embodiments, the width of the connection portion MLPb of the mold pattern MLP may be reduced by the ion beam etching process, and thus a fine connection portion MLPc may be formed. In other words, opening OPb of which lengths in the first direction D1 are greater than those of the preliminary openings OPa may be formed. The openings OPb may be spaced apart from each other in the first direction D1 by a second distance S2 less than the first distance 51. In addition, the second distance S2 between the openings OPb arranged in the first direction D1 may be less than a distance between the openings OPb adjacent to each other in the second direction D2.

Figure 18:
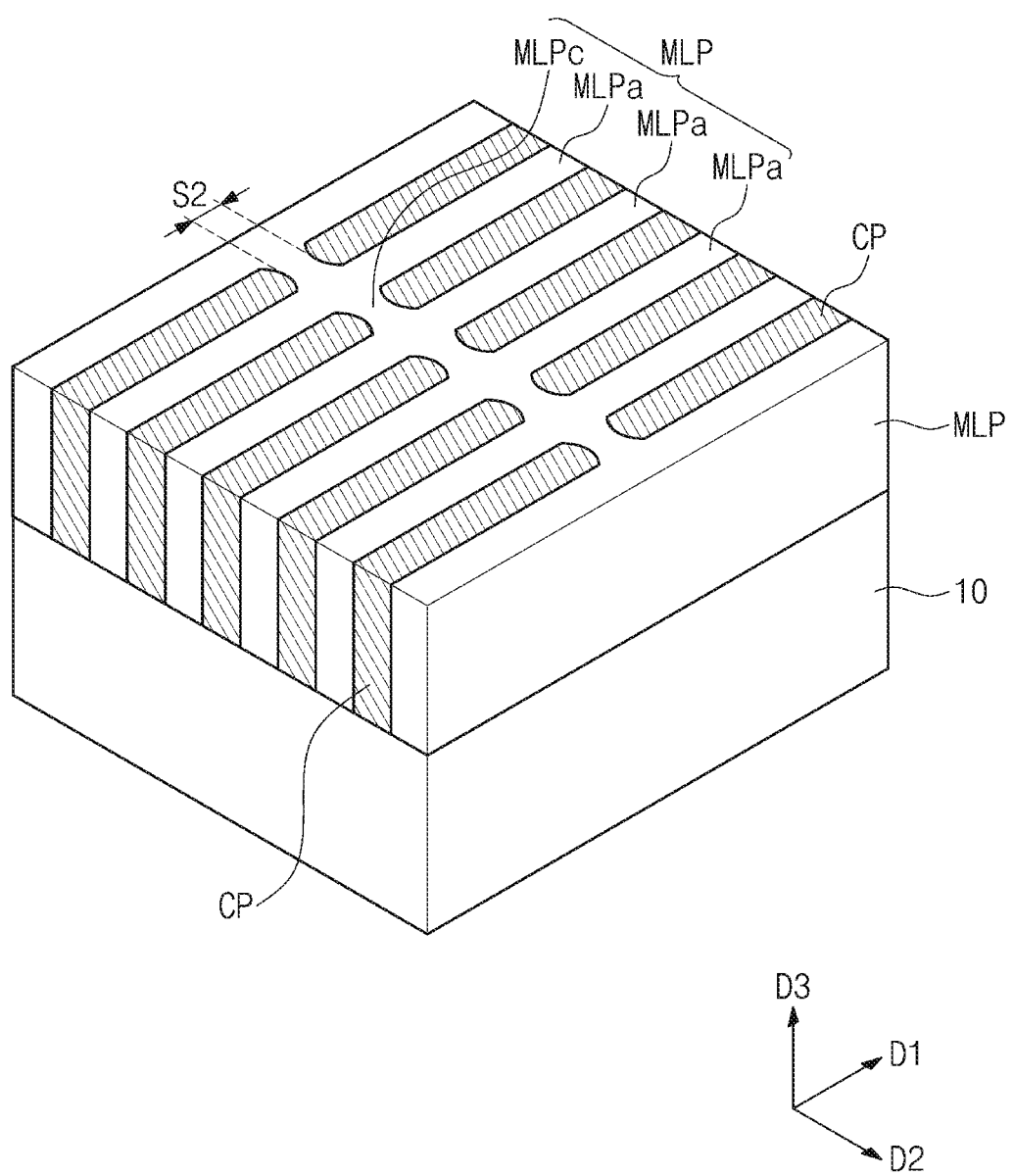

Referring to FIG. 18, conductive patterns CP may be formed in the openings OPb, respectively. The formation of the conductive patterns CP may include forming a conductive layer filling the openings OPb on the mold pattern MLP, and performing a planarization process on the conductive layer to expose a top surface of the mold pattern MLP.

The conductive patterns CP may be spaced apart from each other in the second direction D2 by the line portions MLPa of the mold pattern MLP and may be spaced apart from each other in the first direction D1 by the fine connection portion MLPc of the mold pattern MLP. Here, the distance S2 between the conductive patterns CP adjacent to each other in the first direction D1 may be less than the distance between the conductive patterns CP adjacent to each other in the second direction D2. In addition, the distance S2 between the conductive patterns CP adjacent to each other in the first direction D1 may be less than a minimum distance (or a minimum resolution) realized by an exposure process.

In example embodiment shown in FIGS. 15-18, the width of OPa need not be the same as the width of OPb. In example embodiments, the ion beam can be applied to various widths, regardless of width.

Figure 19:
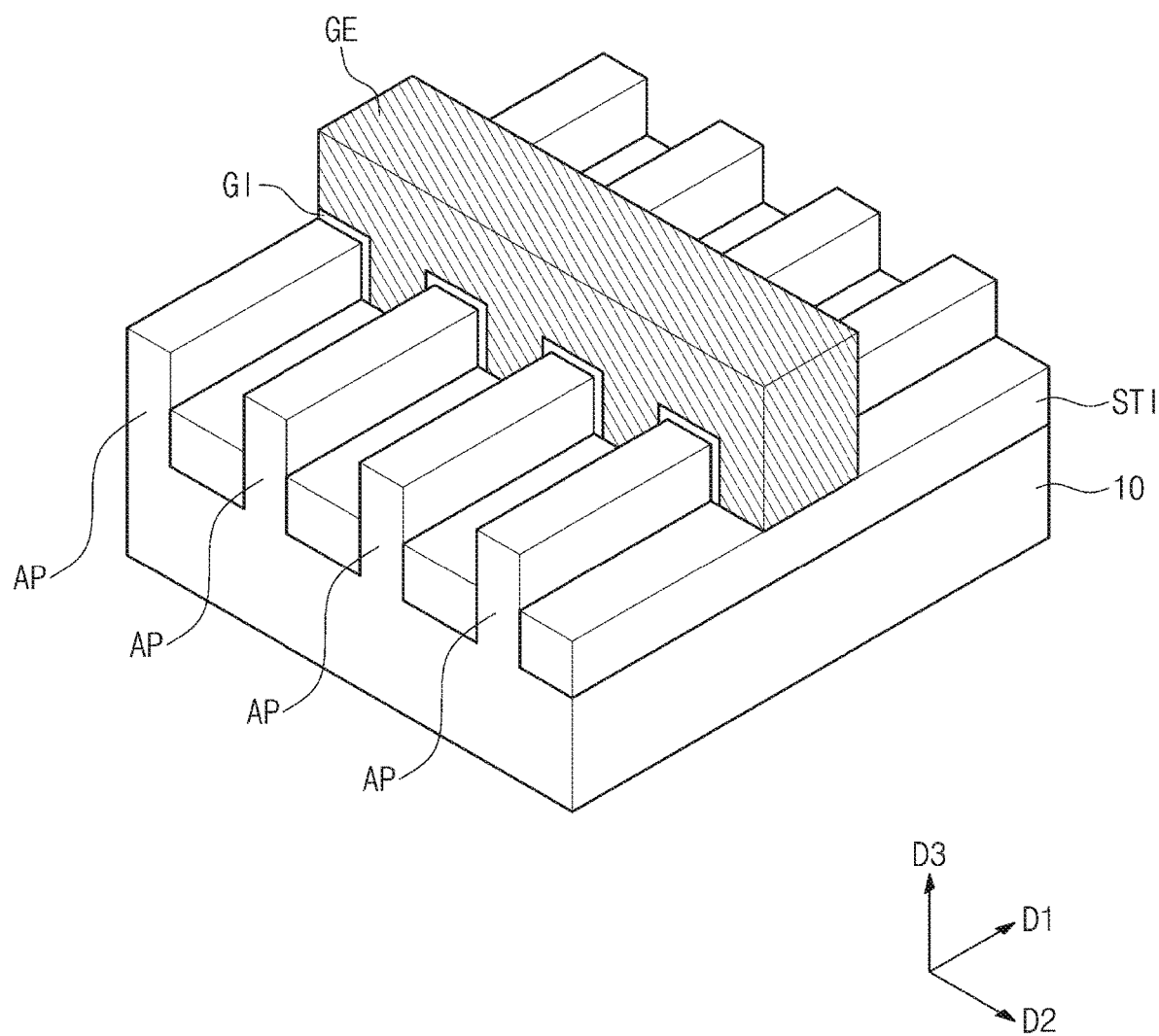
FIG. 19 is a perspective view illustrating a semiconductor device formed using a method for forming a fine pattern, according to some example embodiments of the inventive concepts.

FIG. 19 is a perspective view illustrating a semiconductor device formed using a method for forming a fine pattern, according to some example embodiments of the inventive concepts.

Referring to FIG. 19, a semiconductor device may include active patterns AP extending in parallel in a first direction D1, a gate electrode GE extending in a second direction D2 to intersect the active patterns AP, and a gate insulating layer GI disposed between the gate electrode GE and the active patterns AP. In addition, the semiconductor device may include source/drain regions which are formed by providing dopants into the active patterns AP at both sides of the gate electrode GE.

The active patterns AP may be portions of a semiconductor substrate 10, which protrude from a top surface of the semiconductor substrate 10. The gate electrode GE, the active patterns AP, the gate insulating layer GI and the source/drain regions may constitute a field effect transistor, and the active patterns AP may be used as channel regions.

The active patterns AP may have bar shapes extending in the first direction D1 and may be two-dimensionally arranged on the semiconductor substrate 10. According to some example embodiments, the active patterns AP may be formed using the method for forming the fine pattern according to the example embodiments described above with reference to FIGS. 2 to 8 or the method for forming the fine pattern according to the example embodiments described above with reference to FIGS. 9 to 14.

A device isolation layer STI may be disposed between the active patterns AP. A top surface of the device isolation layer STI may be lower than top surfaces of the active patterns AP. In other words, both sidewalls and a top surface of an upper portion of each of the active patterns AP may be exposed by the device isolation layer STI.

The gate electrode GE may have a line shape which extends in the second direction D2 to intersect the active patterns AP. The gate electrode GE may cover both sidewalls and a top surface of each of portions of the active patterns AP.

A gate conductive layer may be deposited on the semiconductor substrate 10 having the active patterns AP, and a patterning process may be performed on the gate conductive layer to form the gate electrode GE. According to some example embodiments, the gate electrode GE may be formed using the method for forming the fine pattern according to the example embodiments described above with reference to FIGS. 2 to 8 or the method for forming the fine pattern according to the example embodiments described above with reference to FIGS. 9 to 14.

According to some example embodiments of the inventive concepts, a residual pattern remaining between line mask patterns may be selectively removed using an ion beam irradiated in an incident direction which forms an incidence angle with the top surface of the semiconductor substrate and is parallel to a plane defined by a longitudinal direction of the line mask pattern and a direction perpendicular to the top surface of the semiconductor substrate. In addition, the incidence angle of the ion beam may be adjusted to selectively remove the residual pattern without increasing a depth of a recessed portion formed at one of the line mask patterns. Thus, it is possible to reduce or minimize process defects when fine patterns of a semiconductor device are formed using the line mask patterns. As a result, a yield of semiconductor devices may be improved.

In addition, a width of a connection pattern intersecting line patterns may be reduced using an ion beam provided in an incident direction which has an incidence angle and is parallel to a plane defined by a longitudinal direction of the line pattern and a direction perpendicular to the top surface of the semiconductor substrate. Thus, it is possible to reduce a distance between conductive patterns formed with the connection pattern interposed therebetween.

In other example embodiments, in addition to, or in combination with varying the incidence angle θt, the kind of ions and/or ion beam energy may also be varied to achieve selective etching. For example, a noble gas such as He+, Xe+, and/or Kr+ may be used in an etching process together with Ar+. In other example embodiments, ions containing fluorine and/or oxygen may be used in an etching process together with Ar+. In other example embodiments, the ion beam energy may also be varied in a range of from 0 eV to 2000 eV.

While the inventive concepts have been described with reference to example embodiments, it will be apparent to those skilled in the art that various changes and modifications may be made without departing from the spirits and scopes of the inventive concepts. Therefore, it should be understood that the above example embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A method for forming a fine pattern, the method comprising:
   forming line patterns and a connection pattern on a semiconductor substrate, the line patterns extending in a first direction and spaced apart from each other in a second direction intersecting the first direction, and the connection pattern connecting portions of the line patterns adjacent to each other in the second direction; and
   performing an ion beam etching process on the connection pattern,
   wherein the ion beam etching process provides an ion beam in an incident direction parallel to a plane defined by the first direction and a third direction perpendicular to a top surface of the semiconductor substrate, and the incident direction of the ion beam is not perpendicular to the top surface of the semiconductor substrate.

2. The method of claim 1, wherein the ion beam etching process irradiates the ion beam toward a sidewall of the connection pattern.

3. The method of claim 1, wherein one of the line patterns has a recessed portion which is recessed from a top surface of the one line pattern, and
   wherein an incidence angle of the ion beam is adjusted depending on a depth of the recessed portion in the ion beam etching process, and the incidence angle is defined as an angle between the incident direction and the top surface of the semiconductor substrate.

4. The method of claim 1, wherein a height of the connection pattern is less than heights of the line patterns on the semiconductor substrate.

5. The method of claim 1, wherein a height of the connection pattern is substantially equal to heights of the line patterns.

6. The method of claim 1, further comprising:
   forming a lower layer on the semiconductor substrate, wherein the line patterns and the connection pattern are formed on the lower layer,
   wherein the performing of the ion beam etching process comprises: removing the connection pattern to expose the lower layer between the line patterns adjacent to each other in the second direction.

7. The method of claim 1, further comprising:
   sequentially forming a lower layer and a mask layer on the semiconductor substrate; and
   forming a photoresist pattern on the mask layer, wherein the photoresist pattern comprises: line portions extending in the first direction; and a residual portion locally remaining between the line portions adjacent to each other in the second direction,
   wherein the forming of the line patterns and the connection pattern comprises: anisotropically etching the mask layer using the photoresist pattern as an etch mask.

8. The method of claim 7, wherein the forming of the photoresist pattern comprises:
   forming a photoresist layer on the mask layer;
   performing an exposure process irradiating extreme ultraviolet (EUV) to the photoresist layer; and
   developing the exposed photoresist layer.

9. The method of claim 7, wherein the mask layer is a spin-on-hardmask (SOH) layer, a spin-on-carbon (SOC) layer, or an amorphous carbon layer (ACL).

10. The method of claim 1, wherein the line patterns and the connection pattern are formed of a photoresist.

11. The method of claim 1, wherein the performing of the ion beam etching process comprises: reducing a width of the connection pattern in the first direction.

12. The method of claim 11, further comprising:
    forming conductive patterns in openings defined by the line patterns and the connection pattern, respectively, after the performing of the ion beam etching process,
    wherein the conductive patterns extend in the first direction; and the conductive patterns are spaced apart from each other in the second direction by the line patterns and are spaced apart from each other in the first direction by the connection pattern.

13. The method of claim 11, wherein the line patterns and the connection pattern are formed of an insulating material.

14. A method for forming a fine pattern, the method comprising:
    sequentially forming a lower layer and an organic mask layer on a semiconductor substrate;
    forming a hard mask pattern on the organic mask layer, the hard mask pattern comprising: first line portions extending in parallel in a first direction; and a first connection portion between the first line portions adjacent to each other;
    anisotropically etching the organic mask layer using the hard mask pattern as an etch mask to form an organic mask pattern which comprises: second line portions under the first line portions of the hard mask pattern; and a second connection portion under the first connection portion of the hard mask pattern; and
    selectively ion-beam-etching the second connection portion of the organic mask pattern,
    wherein the ion-beam-etching of the second connection portion comprises: irradiating an ion beam in an incident direction which is parallel to a plane defined by the first direction and a second direction perpendicular to a top surface of the semiconductor substrate, and
    wherein the incident direction of the ion beam is not perpendicular to the top surface of the semiconductor substrate.

15. The method of claim 14, wherein the ion-beam-etching of the second connection portion comprises: irradiating the ion beam toward a sidewall of the second connection portion of the organic mask pattern.

16. The method of claim 14, wherein the ion-beam-etching of the second connection portion comprises: removing the second connection portion of the organic mask pattern to expose a bottom surface of the first connection portion of the hard mask pattern.

17. The method of claim 14, wherein heights of the second line portions are substantially equal to a height of the second connection portion in the organic mask pattern.

18. The method of claim 14, further comprising:
    anisotropically etching the lower layer using the second line portions of the organic mask pattern as etch masks to form lower patterns, after the ion-beam-etching of the second connection portion,
    wherein the lower patterns extend in the first direction and are laterally separated from each other.

19. The method of claim 14, further comprising:
    sequentially forming a hard mask layer and a photoresist layer on the organic mask layer, before the forming of the hard mask pattern; and performing exposure and development processes on the photoresist layer to form a photoresist pattern which comprises: line portions extending in parallel in the first direction; and a residual portion between the line portions adjacent to each other, wherein the forming of the hard mask pattern comprises: anisotropically etching the hard mask layer using the photoresist pattern as an etch mask.

20. The method of claim 19, wherein a height of the residual portion is less than heights of the line portions in the photoresist pattern.

* * * * *